(12) United States Patent
Chen et al.

(10) Patent No.: US 10,833,686 B2
(45) Date of Patent: Nov. 10, 2020

(54) PROGRAMMABLE VCO, METHOD OF CALIBRATING THE VCO, PLL CIRCUIT WITH PROGRAMMABLE VCO, AND SETUP METHOD FOR THE PLL CIRCUIT

(71) Applicant: ams AG, Premstaetten (AT)

(72) Inventors: Jia Sheng Chen, Graz (AT); Gregor Schatzberger, Graz (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/478,385

(22) PCT Filed: Jan. 23, 2018

(86) PCT No.: PCT/EP2018/051559
§ 371 (c)(1),
(2) Date: Jul. 16, 2019

(87) PCT Pub. No.: WO2018/149595
PCT Pub. Date: Aug. 23, 2018

(65) Prior Publication Data
US 2019/0372578 A1 Dec. 5, 2019

(30) Foreign Application Priority Data
Feb. 14, 2017 (EP) .................................. 17156093

(51) Int. Cl.
*H03L 7/099* (2006.01)
*H03L 7/093* (2006.01)
(Continued)

(52) U.S. Cl.
CPC ......... *H03L 7/0995* (2013.01); *H03K 3/0315* (2013.01); *H03L 7/093* (2013.01); *H03L 7/10* (2013.01); *H03L 7/187* (2013.01)

(58) Field of Classification Search
CPC ..... H03L 7/099; H03L 7/0995; H03L 7/0991; H03L 7/10; H03L 7/093; H03L 7/187;
(Continued)

(56) References Cited

U.S. PATENT DOCUMENTS 5,382,922 A    1/1995 Gersbach et al.
5,459,653 A    10/1995 Seto et al.
(Continued)

OTHER PUBLICATIONS

European Patent Office, International Search Report for PCT/EP2018/051559, dated Mar. 21, 2018.

*Primary Examiner* — Ryan Johnson
(74) *Attorney, Agent, or Firm* — Fish & Richardson P.C.

(57) ABSTRACT

The PLL circuit comprises a phase/frequency detector (302), a loop filter (304, 306), a VCO (308) and a feedback loop (320). The VCO can be electrically disconnected from the PLL and comprises a programmable trimming circuit (316) and a current-controlled oscillator (318). For calibration the VCO is electrically disconnected from the loop filter and from the feedback loop, a constant reference voltage is applied to the voltage input (IN), a center frequency programming code (L) is applied to the trimming circuit, the center frequency programming code is iteratively adjusted until a desired center frequency is obtained, a gain programming code (K) is applied to the trimming circuit while the adjusted code is still applied, and the gain programming code is iteratively adjusted until a desired gain is obtained. Then the VCO is connected to the PLL, which is then ready for normal operation.

16 Claims, 5 Drawing Sheets

(51) Int. Cl.
*H03L 7/187* (2006.01)
*H03L 7/10* (2006.01)
*H03K 3/03* (2006.01)

(58) Field of Classification Search
CPC ..... H03L 7/18; H03L 2207/05; H03L 7/1075; H03K 3/0315
See application file for complete search history.

(56) References Cited

U.S. PATENT DOCUMENTS

| | | |
|---|---|---|
| 5,942,949 A | 8/1999 | Wilson et al. |
| 6,552,618 B2 | 4/2003 | Nelson et al. |
| 6,859,073 B1 | 2/2005 | Dai et al. |
| 8,134,392 B2 * | 3/2012 | Kawamoto ............... H03L 7/18 327/147 |
| 2002/0075080 A1 | 6/2002 | Nelson et al. |
| 2010/0203848 A1 | 8/2010 | Darabi |

* cited by examiner

PROGRAMMABLE VCO, METHOD OF CALIBRATING THE VCO, PLL CIRCUIT WITH PROGRAMMABLE VCO, AND SETUP METHOD FOR THE PLL CIRCUIT

BACKGROUND OF THE INVENTION

A phase-locked loop (PLL) is a control system that generates an output signal whose phase is related to the phase of a periodic input signal. A PLL typically comprises a variable-frequency oscillator, which generates a periodic signal, and a phase detector, which compares the phase of that signal with the phase of the input periodic signal, adjusting the oscillator to keep the phases matched. The oscillator may especially be a voltage-controlled oscillator (VCO).

The performance of a voltage-controlled oscillator is represented by its characteristic curve, which gives the output frequency depending on the input voltage. Relevant features are in particular the nominal or target frequency and the gain of the oscillator. Voltage-controlled oscillators are often designed to have a number of operating curves covering different frequency ranges.

Accidental fluctuations of the supply voltage or environmental influences like the ambient temperature, for instance, may cause deviations from the regular performance of a voltage-controlled oscillator. If the oscillator is part of a phase-locked loop, such deviations may adversely affect the desired stable operation of the phase-locked loop.

U.S. Pat. No. 5,942,949 discloses a self-calibrating phase-locked loop, which automatically selects an appropriate operating curve of the voltage-controlled oscillator. The PLL has a frequency detector generating error signals from a comparison of an input signal and a feedback signal, a charge pump generating amounts of charge corresponding to the error signals, a loop filter accumulating the charge to generate a loop-filter voltage, and a voltage-controlled oscillator generating an output signal for feedback. During calibration, a sequence of digital control input values is applied to the voltage-controlled oscillator to select different operating curves until an appropriate operating curve for the present PLL application is found. Different signals may be used to determine whether the center frequency of each operating curve in the sequence is above or below the desired nominal operating frequency for the voltage-controlled oscillator.

U.S. Pat. No. 6,552,618 B2 discloses a self-calibrating phase-locked loop having a voltage-controlled oscillator. The center frequency and the gain of the oscillator are automatically calibrated by selecting an appropriate operating curve.

U.S. Pat. No. 6,859,073 B1 discloses a method of calibrating a voltage-controlled oscillator that is employed in a phase-locked loop. Further to a coarse control connected to a charge pump output, the center frequency of the oscillator is trimmed close to the desired frequency. The gain of the oscillator is not calibrated independently of the center frequency.

SUMMARY OF THE INVENTION

The voltage-controlled oscillator (VCO) allows to adjust the center frequency and the gain separately. In a phase-locked loop (PLL) provided with the voltage-controlled oscillator, the adjustment of the oscillator takes place before the normal operation of the phase-locked loop is started.

Two phases are performed for calibration. In the first phase, the voltage-controlled oscillator is trimmed to a desired center frequency. In the second phase, the gain of the voltage-controlled oscillator is adjusted without changing the selected center frequency. Thus the voltage-controlled oscillator is provided with a desired characteristic curve, in particular for changing conditions of process, supply voltage and/or temperature. The stability of operation of the phase-locked loop under changing conditions is improved.

The programmable voltage-controlled oscillator comprises a voltage input, an output and a circuit configured to generate an oscillator frequency depending on a voltage applied to the voltage input. The oscillator frequency is supplied at the output. The circuit of the VCO comprises a trimming circuit and a current-controlled oscillator. The trimming circuit provides an input current for the current-controlled oscillator. The trimming circuit is programmable and is configured to derive the input current from a first programming code and a second programming code, which is independent of the first programming code.

In an embodiment of the programmable voltage-controlled oscillator, the trimming circuit comprises a first programmable component and a second programmable component. The first programmable component is configured to generate a first current according to the first programming code while a constant reference voltage is applied to the voltage input. The second programmable component is configured to generate a second current according to the second programming code while the reference voltage is applied to the voltage input. The input current comprises the first current and the second current.

In a further embodiment of the programmable voltage-controlled oscillator, the first programmable component comprises a digital-to-analog converter, and the second programmable component comprises a voltage-to-current converter.

In a further embodiment of the programmable voltage-controlled oscillator, the trimming circuit comprises a current summing circuit, which is configured to generate the input current for the current-controlled oscillator by adding the first current and the second current.

In a further embodiment of the programmable voltage-controlled oscillator, the first programming code is variable, thus enabling to adjust a center frequency, and the second programming code is variable independently of the first programming code, thus enabling to adjust a gain while the adjustment of the center frequency is maintained.

In a further embodiment of the programmable voltage-controlled oscillator, a first programming component provides the first programming code, and a second programming component provides the second programming code.

The method of calibrating the programmable voltage-controlled oscillator comprises applying a constant reference voltage to the voltage input, applying the first programming code, iteratively adjusting the first programming code until a desired center frequency is obtained, applying the second programming code while maintaining the adjusted first programming code applied, and iteratively adjusting the second programming code until a desired gain is obtained.

The phase-locked loop circuit comprises a phase/frequency detector, a loop filter connected to the phase/frequency detector, a voltage-controlled oscillator with a voltage input and an output, and a feedback loop from the output to the phase/frequency detector. The voltage input of the voltage-controlled oscillator is connected to the loop filter. The voltage-controlled oscillator can be electrically disconnected from the loop filter and from the feedback loop. The voltage-controlled oscillator comprises a trimming circuit and a current-controlled oscillator. The trimming circuit provides an input current for the current-controlled oscillator. The trimming circuit is programmable and configured to derive the input current from a first programming code and a second programming code, which is independent of the first programming code.

In an embodiment of the phase-locked loop circuit, the trimming circuit comprises a first programmable component and a second programmable component. The first programmable component is configured to generate a first current according to the first programming code while a constant reference voltage is applied to the voltage input. The second programmable component is configured to generate a second current according to the second programming code while the reference voltage is applied to the voltage input. The input current comprises the first current and the second current.

In a further embodiment of the phase-locked loop circuit, the first programmable component comprises a digital-to-analog converter, and the second programmable component comprises a voltage-to-current converter.

In a further embodiment of the phase-locked loop circuit, the trimming circuit comprises a current summing circuit, which is configured to generate the input current for the current-controlled oscillator by adding the first current and the second current.

In a further embodiment of the phase-locked loop circuit, the first programming code is variable, thus enabling to adjust a center frequency, and the second programming code is variable independently of the first programming code, thus enabling to adjust a gain while the adjustment of the center frequency is maintained.

In a further embodiment of the phase-locked loop circuit, a first programming component provides the first programming code, and a second programming component provides the second programming code.

A further embodiment of the phase-locked loop circuit comprises switches, which are configured to allow a temporary disconnection of the voltage-controlled oscillator from the loop filter and from the feedback loop, a temporary application of a reference voltage to the voltage input of the voltage-controlled oscillator, and an alternative connection of the first programming code and the second programming code to the trimming circuit.

The setup method for the phase-locked loop circuit comprises disconnecting the voltage-controlled oscillator from the loop filter and from the feedback loop, applying a constant reference voltage to the voltage input), applying the first programming code, iteratively adjusting the first programming code until a desired center frequency is obtained, applying the second programming code while maintaining the adjusted first programming code applied, iteratively adjusting the second programming code until a desired gain is obtained, and connecting the voltage-controlled oscillator to the loop filter and to the feedback loop, so that the phase-locked loop circuit is ready for normal operation.

The following is a more detailed description of the voltage-controlled oscillator and phase-locked loop in conjunction with the appended figures.

DETAILED DESCRIPTION

Figure 1:
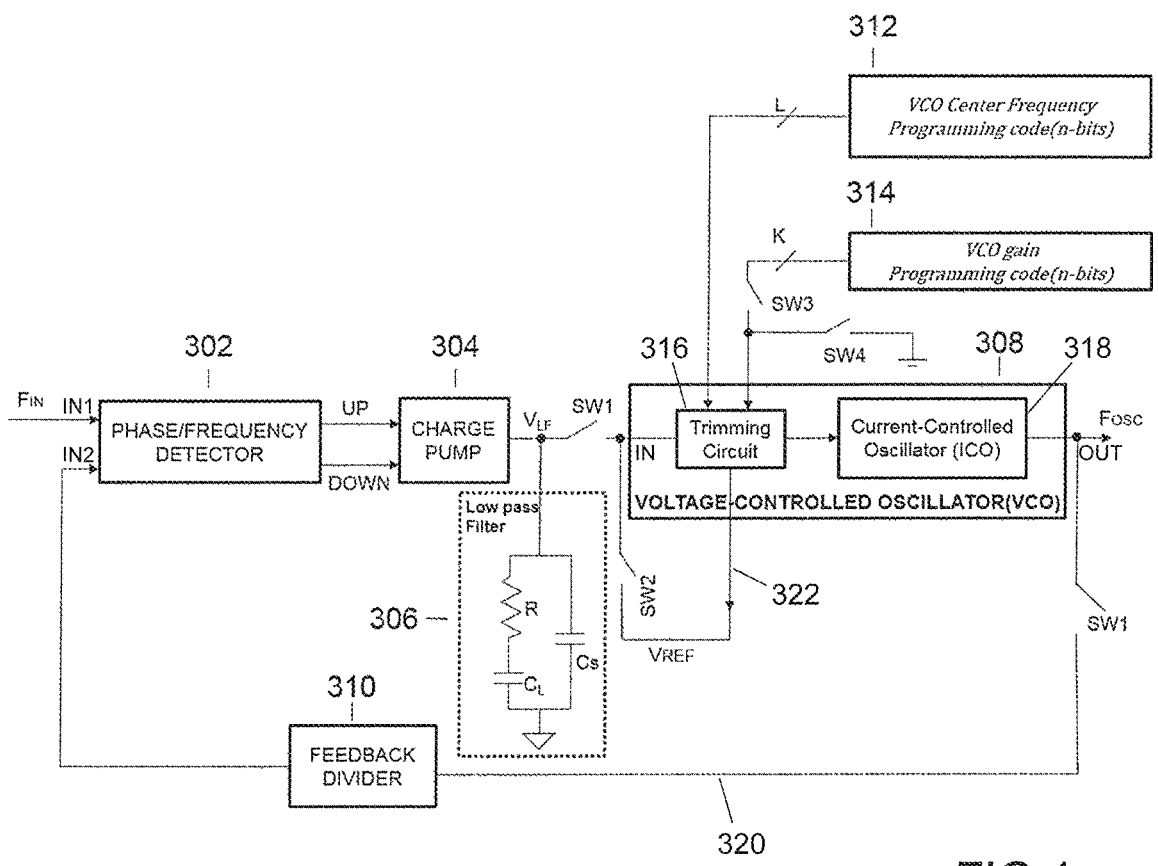
FIG. 1 is a block diagram of a phase-locked loop with adjustable voltage-controlled oscillator.

FIG. 1 is a block diagram of a phase-locked loop including an adjustable voltage-controlled oscillator (VCO). The phase-locked loop comprises a phase/frequency detector 302, a loop filter 304/306 and a voltage-controlled oscillator 308. The phase/frequency detector 302 has a signal input IN1 and is configured to detect a frequency $F_{IN}$ of an input signal that is applied to the signal input IN1. The loop filter 304/306 is connected to an output of the phase/frequency detector 302.

A loop filter voltage $V_{LF}$ is supplied at an output of the loop filter 304/306. The voltage input IN of the voltage-controlled oscillator 308 can be connected to the output of the loop filter 304/306, so that the loop filter voltage $V_{LF}$ can be applied to the input IN of the voltage-controlled oscillator 308.

The output OUT of the voltage-controlled oscillator 308 is releasably connected with a feedback loop 320, which is connected to a feedback input IN2 of the phase/frequency detector 302. The feedback loop 320 can include an optional feedback divider 310, for instance. An oscillator frequency $F_{OSC}$ that is supplied at the output OUT of the voltage-controlled oscillator 308 can be applied to the feedback input IN2 of the phase/frequency detector 302 via the feedback loop 320, and in particular via the feedback divider 310.

The loop filter 304/306 may especially be formed by a charge pump 304 and a low-pass filter 306, which accumulates the net charge from the charge pump 304, as shown in FIG. 1 by way of example. The low-pass filter 306 is connected to a node between the charge pump 304 and the voltage input IN of the voltage-controlled oscillator 308. The low-pass filter 306 may comprise a capacitor $C_S$ in parallel with a series connection of a resistor R and a relatively large capacitor $C_L$. Other types of low-pass filters can be applied instead.

The voltage-controlled oscillator 308 comprises a trimming circuit 316, which also provides the voltage input IN of the voltage-controlled oscillator 308, and a current-controlled oscillator (ICO) 318, which is connected to an output of the trimming circuit 316 and also provides the output OUT of the voltage-controlled oscillator 308. The current-controlled oscillator 318 may be any suitable type of oscillator and can especially be designed as a conventional ring oscillator, for instance. The current-controlled oscillator 318 is directly driven by the output current of the trimming circuit 316.

A first programming component 312 and a second programming component 314 are connected to the trimming circuit 316. The first programming component 312 provides a VCO center frequency programming code L. The second programming component 314 provides a VCO gain programming code K.

A reference voltage $V_{REF}$ is provided by an external circuitry or by a component of the phase-locked loop, in particular a component of the voltage-controlled oscillator 308. The reference voltage $V_{REF}$ is selected to be the nominal center voltage of the input voltage range over which the voltage-controlled oscillator 308 is designed to operate, and may especially be set to $V_{DD}/2$, for instance, where $V_{DD}$ is a supply voltage.

The phase-locked loop allows the reference voltage $V_{REF}$ to be temporarily applied to the voltage input IN of the voltage-controlled oscillator 308. The reference voltage $V_{REF}$ may in particular be provided by the trimming circuit 316 and may be applied to the voltage input IN of the voltage-controlled oscillator 308 via a further feedback loop 322 connecting a further output of the trimming circuit 316 to the voltage input IN of the voltage-controlled oscillator 308.

A first switch SW1 is provided for simultaneously opening or closing the connection between the loop filter 304/306 and the voltage-controlled oscillator 308 and the connection between the voltage-controlled oscillator 308 and the feedback loop 320. The first switch SW1 is provided to connect the voltage-controlled oscillator 308 to the other components of the phase-locked loop for normal operation and to disconnect the voltage-controlled oscillator 308 from the other components of the phase-locked loop for calibration.

A second switch SW2 is provided to allow a temporary application of the reference voltage $V_{REF}$ to the voltage input IN of the voltage-controlled oscillator 308. If the reference voltage $V_{REF}$ is provided by the trimming circuit 316, the second switch SW2 may suitably be arranged in the further feedback loop 322 between the further output of the trimming circuit 316 and the voltage input IN of the voltage-controlled oscillator 308.

A third switch SW3 is arranged between the component 314 providing the VCO gain programming code K and the trimming circuit 316 and allows to supply the trimming circuit 316 with the VCO gain programming code K during calibration. A fourth switch SW4 allows to connect ground to a node between the third switch SW3 and the trimming circuit 316.

The first switch SW1 and the second switch SW2 may be coupled, as they are to be switched simultaneously. Likewise, the third switch SW3 and the fourth switch SW4 may be coupled. Different configurations of the phase-locked loop are obtained by the switches SW1, SW2, SW3, SW4.

The first switch SW1 and the second switch SW2 are used to switch between a configuration for calibration and a configuration for normal PLL operation. The third switch SW3 and the fourth switch SW4 are used during calibration to switch between a configuration for the adjustment of the center frequency and a configuration for the adjustment of the gain of the voltage-controlled oscillator 308, which is thus calibrated to have an appropriate characteristic curve.

When calibration is finished, the configuration is changed by switching the first switch SW1 and the second switch SW2 in order to allow regular operation of the phase-locked loop.

Figure 2:
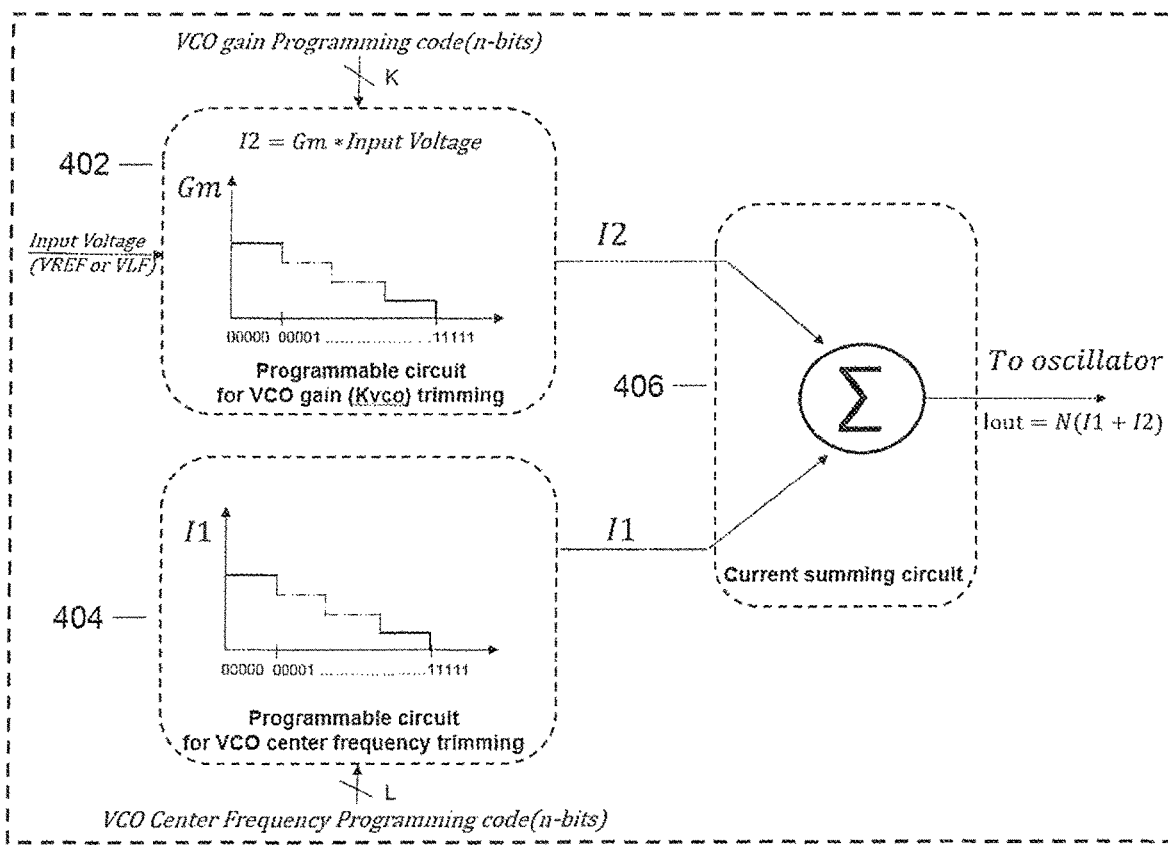
FIG. 2 is a block diagram of a trimming circuit of the voltage-controlled oscillator.

FIG. 2 is a block diagram of a suitable trimming circuit 316 of the voltage-controlled oscillator 308. The example of the trimming circuit 316 according to FIG. 2 comprises a voltage-to-current converter 402, a digital-to-analog converter (DAC, D/A) 404 for current, and a current summing circuit 406.

The digital-to-analog converter 404 is provided as a programmable circuit for VCO center frequency trimming. The digital-to-analog converter 404 generates a first current I1 according to the supplied VCO center frequency programming code L. In FIG. 2, a diagram in the block representing the digital-to-analog converter 404 illustrates the functional dependence of the generated first current I1 on the bit strings of the VCO center frequency programming code L.

Figure 3:
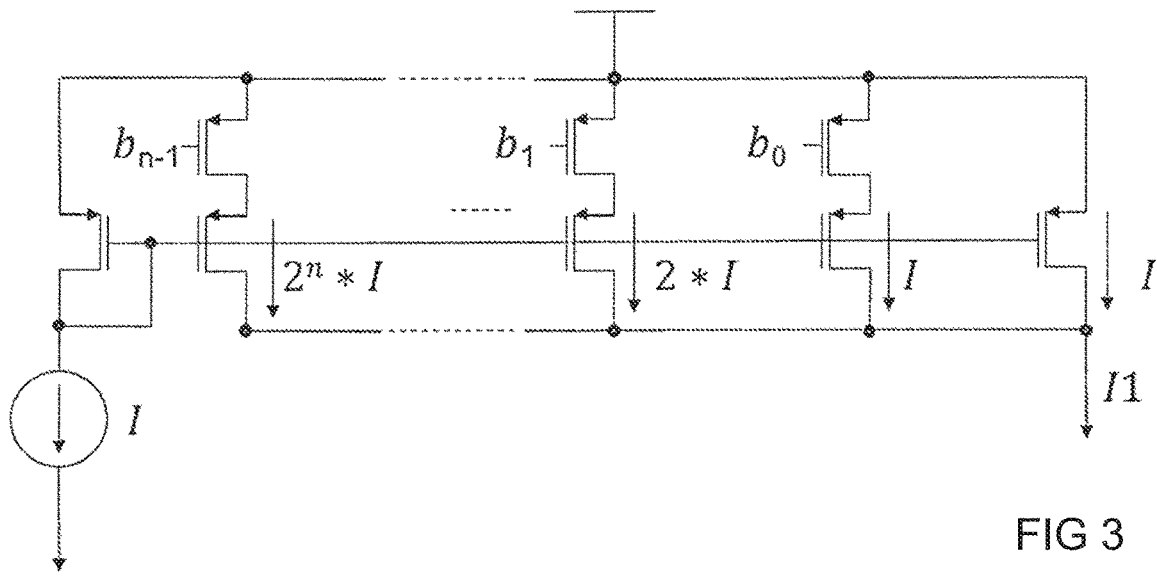
FIG. 3 is a diagram of a programmable circuit for VCO center frequency trimming.

FIG. 3 is a diagram of a programmable circuit for VCO center frequency trimming. It shows a suitable design of a programmable circuit on the transistor level. The circuit can be realized by a conventional current digital-to-analog converter, for instance. The transistors are controlled by binary words of n-bits $b_0, b_1, \ldots, b_{n-1}$ and function as switches responsible to switch sourcing currents.

The voltage-to-current converter 402 is provided as a programmable circuit for VCO gain trimming. The voltage-to-current converter 402 generates a second current I2 from an input voltage according to the supplied VCO gain programming code K. In FIG. 3, a diagram in the block representing the voltage-to-current converter 402 illustrates the functional dependence of the transconductance Gm on the bit strings of the VCO gain programming code K. The output current I2 is the product of Gm and the input voltage, which is the reference voltage $V_{REF}$ during calibration.

Figure 4:
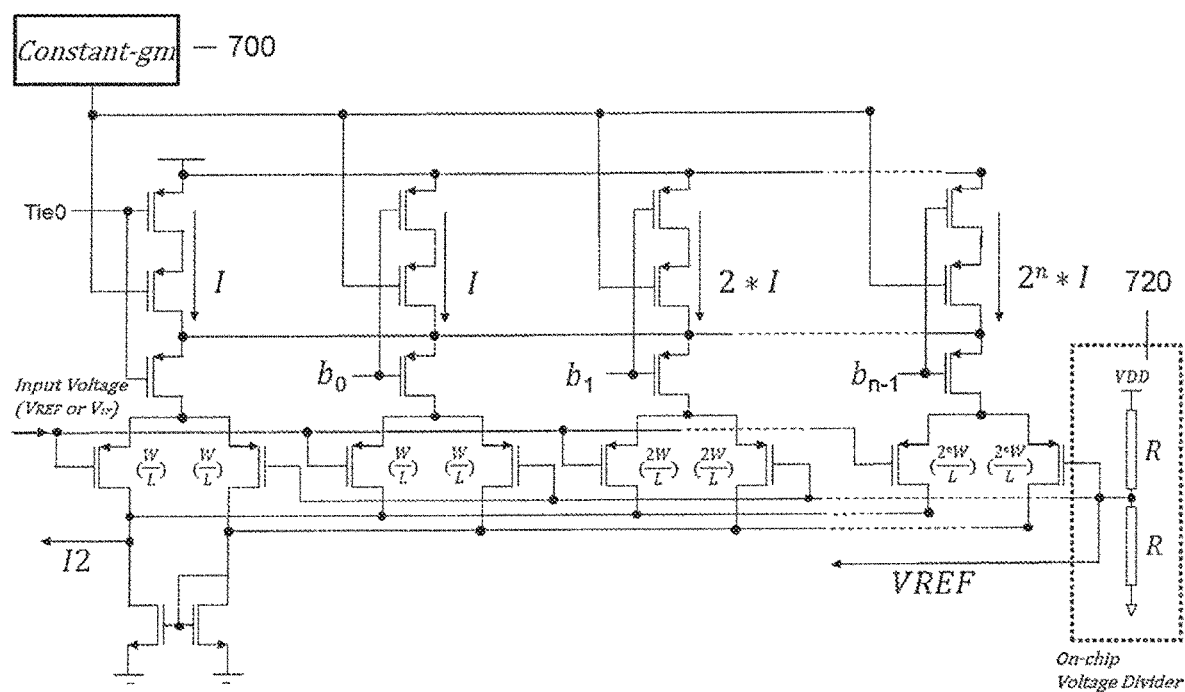
FIG. 4 is a diagram of a programmable circuit for VCO gain trimming.

FIG. 4 is a diagram of a programmable circuit for VCO gain trimming. It shows a suitable design of a programmable circuit on the transistor level. The circuit can be realized by a voltage-to-current converter. The transconductance of the voltage-to-current converter according to FIG. 4 can be trimmed. A constant-transconductance circuit 700, which is schematically indicated in FIG. 4, is used to provide a bias current. The transistors are controlled by binary words of n-bits $b_0, b_1, \ldots, b_{n-1}$, and function as switches responsible to switch sourcing currents. By switching each differential branch of the circuit, different transconductances $$gm = 2\sqrt{ID \cdot \frac{1}{2} Cox\mu o\left(\frac{W}{L}\right)} \approx \sqrt{ID \cdot \left(\frac{W}{L}\right)}$$

of the programmable circuit can be achieved.

A voltage divider may be employed to provide the reference voltage $V_{REF}$. It can be realized with transistors, for instance. The voltage divider may especially be part of the voltage-to-current converter 402, in particular as an integrated circuit. In the programmable circuit for VCO gain trimming shown in FIG. 4, a voltage divider 720 is formed by two resistors R connected in series between the supply voltage $V_{DD}$ and ground. Such a voltage divider has the advantage that it can be made very small. Moreover, as the voltage divider 720 always generates the same voltage, irrespective of the switches SW1, SW2, no errors are caused by a mismatch of a voltage applied during calibration and a voltage applied during normal PLL operation.

Figure 5:
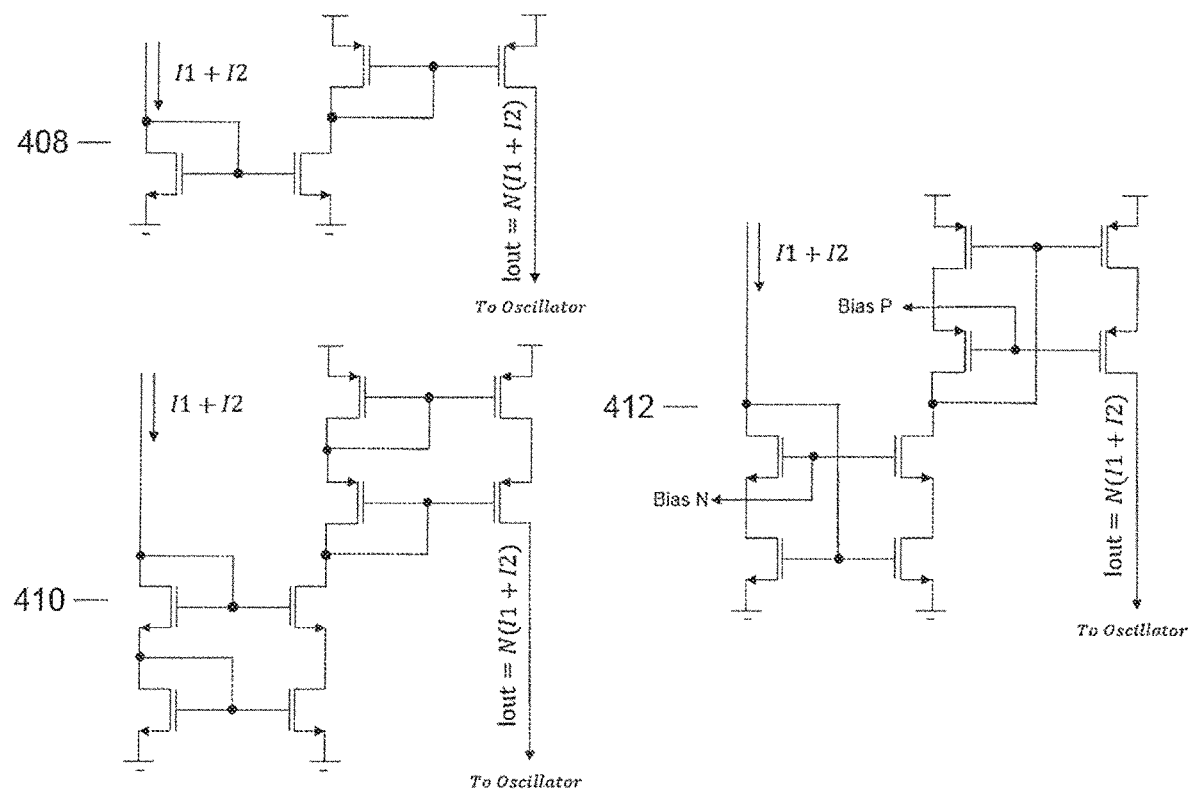
FIG. 5 shows circuit diagrams for current summing.
Figure 6:
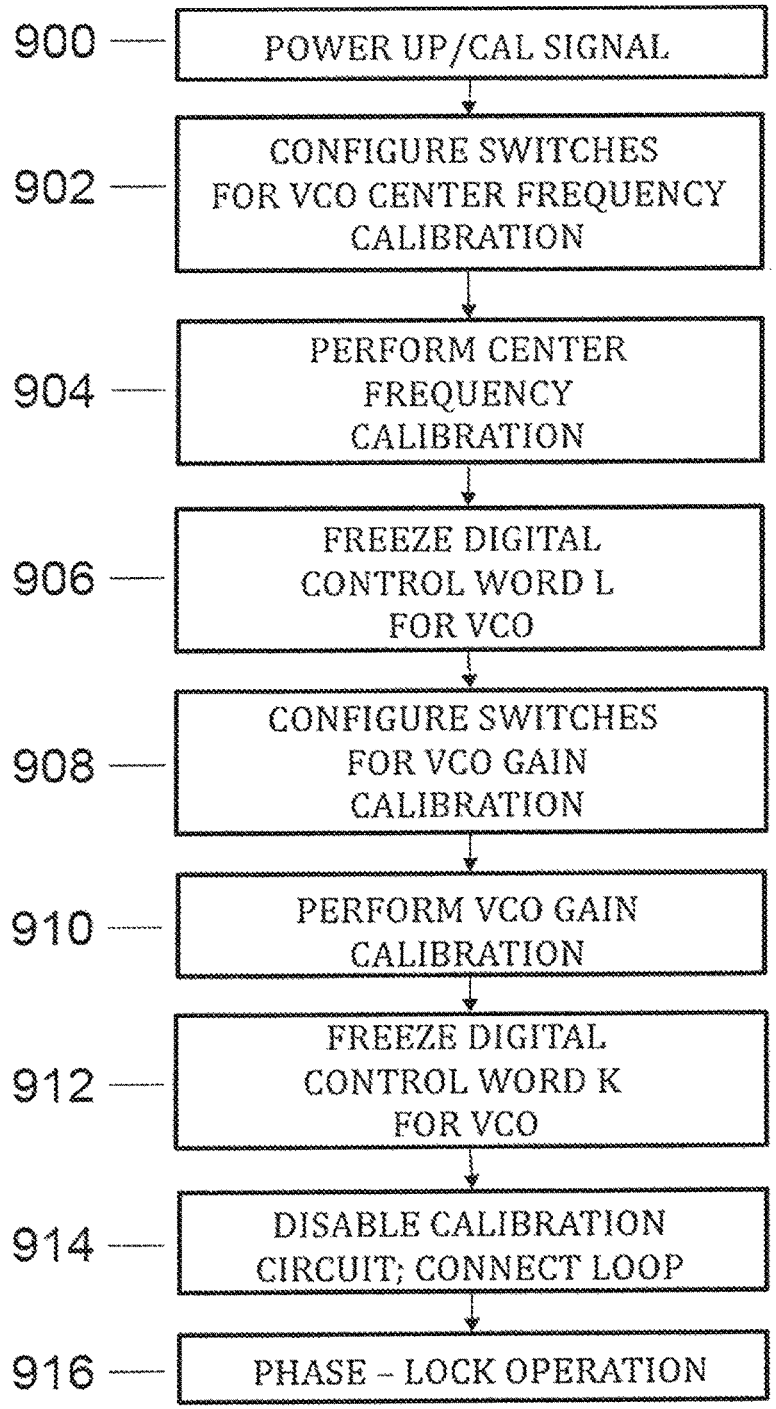
FIG. 6 is a flow diagram of an adjustment process for a phase-locked loop.

The current summing circuit 406 is provided to sum the first current I1 generated by the digital-to-analog converter 404 and the second current I2 generated by the voltage-to-current converter 402. The current summing circuit 406 may be any circuit that can be employed to sum currents, in particular a current mirror, for instance. FIG. 5 shows a simple current mirror 408, a cascode current mirror 410, and a wide swing cascade current mirror 412, by way of example.

The following is a description of the calibration of the voltage-controlled oscillator 308. During calibration the preselected reference voltage $V_{REF}$ is permanently applied to the voltage input IN of the voltage-controlled oscillator 308. For this purpose, the first switch SW1 is opened to interrupt the connection between the loop filter 304, 306 and the voltage-controlled oscillator 308, and the second switch SW2 is closed. In particular, the further feedback loop 322 is closed by the second switch SW2.

In a first phase of the calibration, the third switch SW3 is opened and the fourth switch SW4 is closed, so that the trimming circuit 316 is only programmed by the VCO center frequency programming code L. In particular, for a trimming circuit 316 according to FIG. 2, the digital-to-analog converter 404 is programmed by the VCO center frequency programming code L, and the first current I1 is generated accordingly. The first current I1 generated by the VCO center frequency programming code L will be designated as I1 (L). As the voltage-to-current converter 402 is not programmed, the second current I2 is kept constant.

In the current summing circuit 406, the first current I1 (L) and the second current I2 are added. The sum current I1 (L)+I2 is used to drive the current-controlled oscillator 318, which generates a corresponding oscillator frequency $F_{OSC}$ (L;$V_{REF}$) at the output OUT of the voltage-controlled oscillator 308.

If the oscillator frequency $F_{OSC}$ (L;$V_{REF}$) is not equal to the desired VCO center frequency, the VCO center frequency programming code L is iteratively changed to adjust the output current I1(L)+I2 of the trimming circuit 316 until the current-controlled oscillator 318 generates the desired oscillator frequency $F_{OSC}$*. The final VCO center frequency programming code $L_{final}$, which yields the desired oscillator frequency $F_{OSC}$*=$F_{OSC}$($L_{final}$; $V_{REF}$), is chosen as a setup for controlling the trimming circuit 316, and in particular the first current I1 ($L_{final}$) generated by the digital-to-analog converter 404 is maintained in the following calibration phase.

In a second phase of the calibration, the third switch SW3 is closed and the fourth switch SW4 is opened, so that the trimming circuit 316 is only programmed by the VCO gain programming code K. In particular, the voltage-to-current converter 402 is programmed by the VCO gain programming code K, and the second current I2 is generated accordingly. The second current I2 generated by the VCO gain programming code K will be designated as I2(K). As the digital-to-analog converter 404 is not programmed, the first current I1=I1 ($L_{final}$) is kept constant. The sum current I1+I2 (K) provided by the current summing circuit 406 is again used to drive the current-controlled oscillator 318, which generates a corresponding oscillator frequency $F_{OSC}$(K) at the output OUT of the voltage-controlled oscillator 308.

When the voltage V(K) corresponding to the applied VCO gain programming code K differs from the reference voltage $V_{REF}$, the difference being $\Delta V=V(K)-V_{REF}$, there is a corresponding difference $\Delta I$ between the current generated by the trimming circuit 316 when the voltage V(K) is applied to the voltage-controlled oscillator 308, and the current generated by the trimming circuit 316 when the voltage $V_{REF}$ is applied to the voltage-controlled oscillator 308. In particular, for a trimming circuit 316 according to FIG. 2, the current difference $\Delta I$ results from different second currents I2(K), I2$_{REF}$ generated by the voltage-to-current converter 402. In this case the current difference $\Delta I$ is the difference between the sum current I1+I2 (K) and the sum current I1+I2$_{REF}$, and this difference is $\Delta I=\Delta I2=I2(K)-I2_{REF}$.

Let $F_{OSC}$(V(K)) be the output frequency that is generated when the voltage V(K) corresponding to the applied VCO gain programming code K is applied to the voltage-controlled oscillator 308, and let $F_{OSC}$ ($V_{REF}$) be the output frequency that is generated when the reference voltage $V_{REF}$ is applied to the voltage-controlled oscillator 308 at constant first current I1 ($L_{final}$). The difference $F_{OSC}$(V (K))−$F_{OSC}$ ($V_{REF}$) will be designated by $\Delta f$. As $\Delta f$ is proportional to $\Delta I$, the gain $K_{VCO}=\Delta f/\Delta V$ of the voltage-controlled oscillator 308 and the transconductance Gm=$\Delta I/\Delta V$ are proportional.

An initial value of the VCO gain programming code K is selected, and the voltage applied to the voltage-controlled oscillator 308 is thereby shifted from the reference voltage $V_{REF}$ to the first modified voltage $V_{REF}+\Delta V$. $\Delta V$ is a small voltage difference, which can be in the range from 20 mV to 25 mV, for instance. A corresponding first shifted oscillator frequency F1=$F_{OSC}$($V_{REF}+\Delta V$) is generated in the voltage-controlled oscillator 308. Then the voltage applied to the voltage-controlled oscillator 308 is shifted to the second modified voltage $V_{REF}-\Delta V$. A corresponding oscillator frequency F2=$F_{OSC}$($V_{REF}-\Delta V$) is generated in the voltage-controlled oscillator 308. The gain of the voltage-controlled oscillator 308 is $K_{VCO}=\Delta f/\Delta V=(F2-F1)/\Delta V$. If the gain is not equal to the desired value, the VCO gain programming code K is changed until the desired gain is obtained for a final VCO gain programming code $K_{final}$.

The gain of the voltage-controlled oscillator 308 can thus be calibrated in the second phase without changing the center frequency, which has already been adjusted in the first phase. In the second phase only the slope of the characteristic curve of the voltage-controlled oscillator 308 is changed. This calibration allows to adjust the gain for different conditions, in particular different conditions relating to process, supply voltage and temperature.

When the desired characteristic curve of the voltage-controlled oscillator 308 is obtained, the calibration is finished. The first switch SW1 is closed, and the second switch SW2 is opened. Consequently, the loop filter voltage $V_{LF}$ is applied to the voltage input IN of the voltage-controlled oscillator 308, the output OUT of the voltage-controlled oscillator 308 is connected to the feedback loop 320, and the phase-locked loop is ready for normal operation. The final VCO center frequency programming code $L_{final}$, which is obtained in the first phase of the calibration, and the final VCO gain programming code $K_{final}$, which is obtained in the second phase of the calibration, are used to adjust the voltage-controlled oscillator 308 during normal operation of the phase-locked loop.

An exemplary process for calibrating a PLL circuit in accordance with the present invention is describe next. Following power up, or responsive to a calibration signal, VCO center frequency calibration is performed. A first configuration of the switches takes place for VCO center frequency calibration, by which the first switch SW1 and the third switch SW3 are opened, and the second switch SW2 and the fourth switch SW4 are closed. Then a first phase of the calibration is performed to adjust the center frequency. A first code freezing ensues whereby the final digital control word L is frozen or stored for the adjustment of the center frequency during normal PLL operation. A second configuration of the switches takes place for VCO gain calibration, by which the third switch SW3 is closed, and the fourth switch SW4 is opened. Then a second phase of the calibration is performed to adjust the gain. A second code freezing ensues whereby the final digital control word K is frozen or stored for the adjustment of the gain during normal PLL operation. A third configuration of the switches takes place, by which the first switch SW1 is closed, and the second switch SW2 is opened to disable the calibration circuit and connect the phase-locked loop, which is then ready for normal PLL operation .

The invention improves the stability of performance of a phase-locked loop under different conditions and helps to avoid disturbances from the environment. The complete VCO and PLL circuits can be realized with integrated components.

The invention claimed is:

1. A programmable voltage-controlled oscillator, comprising:
   a voltage input;
   an output;
   a circuit configured to generate an oscillator frequency depending on a voltage applied to the voltage input, the oscillator frequency being supplied at the output;
   the circuit comprising a trimming circuit and a current-controlled oscillator, wherein the trimming circuit is configured to:
      provide an input current for the current-controlled oscillator, and
      provide a reference voltage; and
   a feedback loop configured to apply the reference voltage to the voltage input selectively;
   the trimming circuit being programmable; and
   the trimming circuit being configured to derive the input current from a first programming code and a second programming code, which is independent of the first programming code.

2. The programmable voltage-controlled oscillator of claim 1, further comprising:
   a first programmable component of the trimming circuit, the first programmable component being configured to generate a first current according to the first programming code while the reference voltage is applied to the voltage input;
   a second programmable component of the trimming circuit, the second programmable component being configured to generate a second current according to the second programming code while the reference voltage is applied to the voltage input; and
   the input current comprising the first current and the second current.

3. The programmable voltage-controlled oscillator of claim 2, wherein
   the first programmable component comprises a digital-to-analog converter; and
   the second programmable component comprises a voltage-to-current converter.

4. The programmable voltage-controlled oscillator of claim 2, further comprising:
   a current summing circuit of the trimming circuit, the current summing circuit being configured to generate the input current for the current-controlled oscillator by adding the first current and the second current.

5. The programmable voltage-controlled oscillator of claim 1, wherein
   the first programming code is variable and enables an adjustment of a center frequency; and
   the second programming code is variable independently of the first programming code and enables an adjustment of a gain while the adjustment of the center frequency is maintained.

6. The programmable voltage-controlled oscillator of claim 1, further comprising:
   a first programming component configured to provide the first programming code; and
   a second programming component configured to provide the second programming code.

7. A method of calibrating the programmable voltage-controlled oscillator of claim 1, the method comprising:
   generating a reference voltage using the trimming circuit;
   applying the reference voltage to the voltage input using the feedback loop;
   applying the first programming code;
   iteratively adjusting the first programming code until a desired center frequency is obtained;
   applying the second programming code while maintaining the adjusted first programming code applied; and
   iteratively adjusting the second programming code until a desired gain is obtained.

8. A phase-locked loop circuit, comprising:
   a phase/frequency detector;
   a loop filter connected to the phase/frequency detector;
   a voltage-controlled oscillator with a voltage input and an output, the voltage input being connected to the loop filter;
   a first feedback loop from the output to the phase/frequency detector;
   the voltage-controlled oscillator being enabled to be electrically disconnected from the loop filter and from the first feedback loop;
   the voltage-controlled oscillator comprising a trimming circuit and a current-controlled oscillator, wherein the trimming circuit is configured to:
      provide an input current for the current-controlled oscillator, and
      provide a reference voltage; and
   a second feedback loop configured to apply the reference voltage to the voltage input selectively;
   the trimming circuit being programmable; and
   the trimming circuit being configured to derive the input current from a first programming code and a second programming code, which is independent of the first programming code.

9. The phase-locked loop circuit of claim 8, further comprising:
   a first programmable component of the trimming circuit, the first programmable component being configured to generate a first current according to the first programming code while the reference voltage is applied to the voltage input;
   a second programmable component of the trimming circuit, the second programmable component being configured to generate a second current according to the second programming code while the reference voltage is applied to the voltage input; and
   the input current comprising the first current and the second current.

10. The phase-locked loop circuit of claim 9, wherein
    the first programmable component comprises a digital-to-analog converter; and
    the second programmable component comprises a voltage-to-current converter.

11. The phase-locked loop circuit of claim 9, further comprising:
    a current summing circuit of the trimming circuit, the current summing circuit being configured to generate the input current for the current-controlled oscillator by adding the first current and the second current.

12. The phase-locked loop circuit of claim 8, wherein
    the first programming code is variable and enables an adjustment of a center frequency; and
    the second programming code is variable independently of the first programming code and enables an adjustment of thus a gain while the adjustment of the center frequency is maintained.

13. The phase-locked loop circuit of claim 8, further comprising:

a first programming component configured to provide the first programming code; and a second programming component configured to provide the second programming code.

14. The phase-locked loop circuit of claim 8, further comprising:

switches configured to allow a temporary disconnection of the voltage-controlled oscillator from the loop filter and from the feedback loop, a temporary application of the reference voltage to the voltage input of the voltage-controlled oscillator, and an alternative connection of the first programming code and the second programming code to the trimming circuit.

15. A setup method for a phase-locked loop circuit comprising a phase/frequency detector, a loop filter connected to the phase/frequency detector, a voltage-controlled oscillator with a voltage input and an output, the voltage input being connected to the loop filter, and a first feedback loop from the output to the phase/frequency detector, comprising:

disconnecting the voltage-controlled oscillator from the loop filter and from the feedback loop;

generating a reference voltage using a trimming circuit of the voltage-controlled oscillator;

applying the reference voltage to the voltage input using a second feedback loop;

applying a first programming code;

iteratively adjusting the first programming code until a desired center frequency is obtained;

applying a second programming code while maintaining the adjusted first programming code applied;

iteratively adjusting the second programming code until a desired gain is obtained; and connecting the voltage-controlled oscillator to the loop filter and to the feedback loop, so that the phase-locked loop circuit is ready for normal operation.

16. A phase-locked loop circuit, comprising:

a phase/frequency detector;

a loop filter connected to the phase/frequency detector;

a voltage-controlled oscillator with a voltage input and an output, the voltage input being connected to the loop filter;

a first feedback loop from the output to the phase/frequency detector;

the voltage-controlled oscillator comprising a trimming circuit and a current-controlled oscillator, wherein the trimming circuit is configured to:

provide an input current for the current-controlled oscillator, and provide a reference voltage; and a second feedback loop configured to apply the reference voltage to the voltage input selectively;

the trimming circuit being programmable and configured to derive the input current from a first programming code and a second programming code, which is independent of the first programming code; and switches configured to allow a temporary disconnection of the voltage-controlled oscillator from the loop filter and from the first feedback loop, a temporary application of the reference voltage to the voltage input of the voltage-controlled oscillator, and an alternative connection of the first programming code and the second programming code to the trimming circuit.

* * * * *